(12) United States Patent
Zverez et al.

(10) Patent No.: US 8,185,337 B1
(45) Date of Patent: *May 22, 2012

(54) SYSTEM, METHOD, AND COMPUTER PROGRAM PRODUCT FOR TESTING AND RE-TESTING INTEGRATED CIRCUITS

(75) Inventors: Maxim Zverez, Sunnyvale, CA (US); Paul Brandariz, San Jose, CA (US); Robert Easton, San Jose, CA (US); Jason Saw, San Jose, CA (US)

(73) Assignee: Invantest, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/902,090

(22) Filed: Oct. 11, 2010

Related U.S. Application Data

(63) Continuation of application No. 11/739,610, filed on Apr. 24, 2007, now Pat. No. 7,835,881.

(60) Provisional application No. 60/794,918, filed on Apr. 24, 2006.

(51) Int. Cl.
*G01R 31/00* (2006.01)
*G01R 31/14* (2006.01)
*G01R 31/26* (2006.01)

(52) U.S. Cl. .................... 702/118; 702/117; 438/14
(58) Field of Classification Search ............. 702/117, 702/118; 438/14
See application file for complete search history.

(56) References Cited

U.S. PATENT DOCUMENTS

| | | | |
|---|---|---|---|
| 5,589,765 A * | 12/1996 | Ohmart et al. | 324/158.1 |
| 6,553,329 B2 * | 4/2003 | Balachandran | 702/118 |
| 6,601,008 B1 * | 7/2003 | Madge | 702/117 |
| 6,764,869 B2 * | 7/2004 | Eldridge | 438/15 |
| 6,857,090 B2 * | 2/2005 | Lee et al. | 714/724 |
| 7,027,946 B2 * | 4/2006 | Williams et al. | 702/117 |
| 7,031,791 B1 * | 4/2006 | Chang | 700/121 |
| 7,221,180 B2 * | 5/2007 | Dallabetta et al. | 324/765 |
| 2003/0062913 A1 * | 4/2003 | Cirkel et al. | 324/754 |
| 2004/0236531 A1 * | 11/2004 | Madge | 702/118 |

* cited by examiner

*Primary Examiner* — Janet Suglo
(74) *Attorney, Agent, or Firm* — Zilka-Kotab, PC

(57) ABSTRACT

A system, method, and computer program product are provided for testing and re-testing integrated circuits. In use, a group of integrated circuits is tested. In use, before finishing the test, at least one of the integrated circuits of the group is re-tested.

19 Claims, 22 Drawing Sheets

SYSTEM, METHOD, AND COMPUTER PROGRAM PRODUCT FOR TESTING AND RE-TESTING INTEGRATED CIRCUITS

RELATED APPLICATIONS

This application is a continuation of application Ser. No. 11/739,610, filed Apr. 24, 2007, which claims the benefit of U.S. Provisional Application No. 60/794,918, filed Apr. 24, 2006, which is herein incorporated by reference in its entirety.

FIELD OF THE INVENTION

The present invention relates to testing integrated circuits, and more particularly to re-testing of integrated circuits.

BACKGROUND

Traditionally, testing of integrated circuits may be accomplished using several different techniques, many of which are complicated with various issues. In a first scenario, for instance, a retest pass may be performed that is separate from an initial test pass. For example, a lot testing cycle may include a first pass, a retest pass, and a quality assurance (QA) pass. After finishing the first pass, the test operations may need to be paused in order to calculate the first pass test results, and to prepare for the next test pass. For example, the next test pass may be a retest pass, a QA pass, etc. However, the work flow in this scenario significantly increases the operational overhead involving human operators, which may further cause unnecessary human errors.

FIG. 1 illustrates performing a retest on all failed devices, in accordance with a second scenario. For example, a lot of device XYZ may contain 10,000 devices that have undergone a first pass of testing 110. Of these 10,000 devices, 9,000 of them passed (see item 112), and 1,000 of them failed (see item 114) a first pass of testing 110. The target yield for device XYZ is 92%. During the first pass of testing 110, the lot has achieved a 90% yield, as shown. Therefore, the lot may have to go through a retest pass in order to meet the 92% target yield. An operator may thus gather the 1,000 failed devices and then prepare for a secondary retest pass 150.

In order to achieve the aforementioned target, 200 devices need to pass in the retest pass 150. For example, it may be assumed that, after testing 400 devices, 200 devices are passed. The 200 passing devices result in the overall lot yield achieving the 92% target yield. However, all remaining 600 devices of the 1000 retest pass must be retested, since the retest pass 150 is separate from the first pass of testing 110. Since the retest pass 150 is separate from the first pass of testing 110, the system cannot perform the internal and automatic calculations on the overall lot yield. Hence, the testing process is unable to make a decision on the necessity of the retest for the remaining 600 devices. Therefore, the existing final test pass is considered inefficient and may require a longer duration for testing.

In yet another scenario, a retest may be performed on a low bin recovery rate. In use, a single lot may contain numerous bins of devices. For example, during the retest of the lot for a device XYZ, it may be difficult to control the process of skipping the retest of a particular bin. Therefore, numerous unnecessary retests may have been performed during the retest pass.

In still yet another scenario, a loss of a first pass test bin result may take place. For example, since the first pass and retest pass may take place separately, the correlation between a first test bin result and a retest bin result for a particular device may be unavailable. After the testing completes, a product engineer may need to know the recovery percentage of each bin that failed in the first pass and recovered in the retest pass. However, it is time consuming to keep track of the test bin result and handle the devices being tested between the first pass and the retest pass.

There is thus a need for addressing these and/or other issues associated with the prior art.

SUMMARY

A system, method, and computer program product are provided for testing and re-testing integrated circuits. In use, a group of integrated circuits is tested. In use, before finishing the test, at least one of the integrated circuits of the group is re-tested.

DETAILED DESCRIPTION

Figure 1:
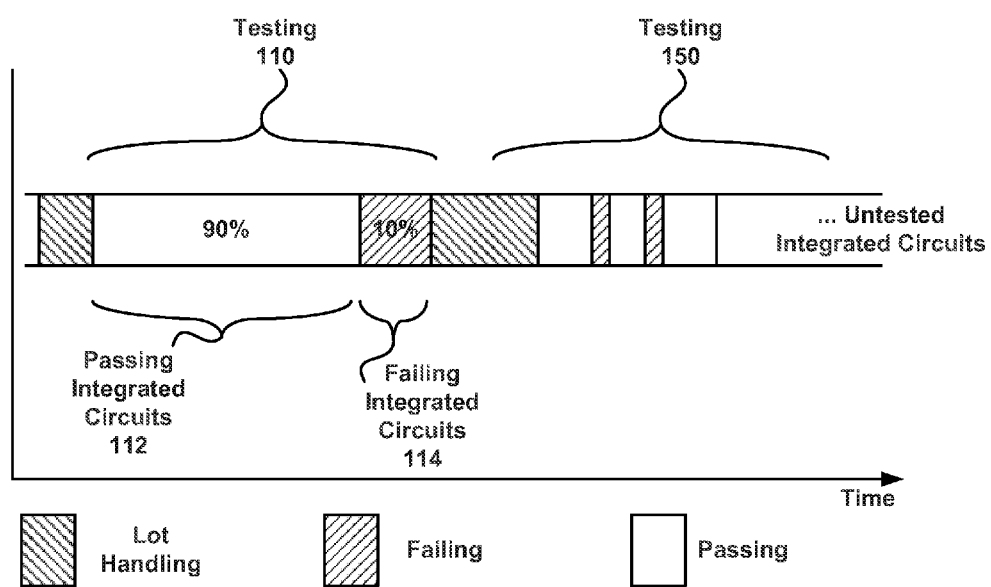
FIG. 1 illustrates a technique for performing a retest on all failed devices, in accordance with the prior art.
Figure 2:
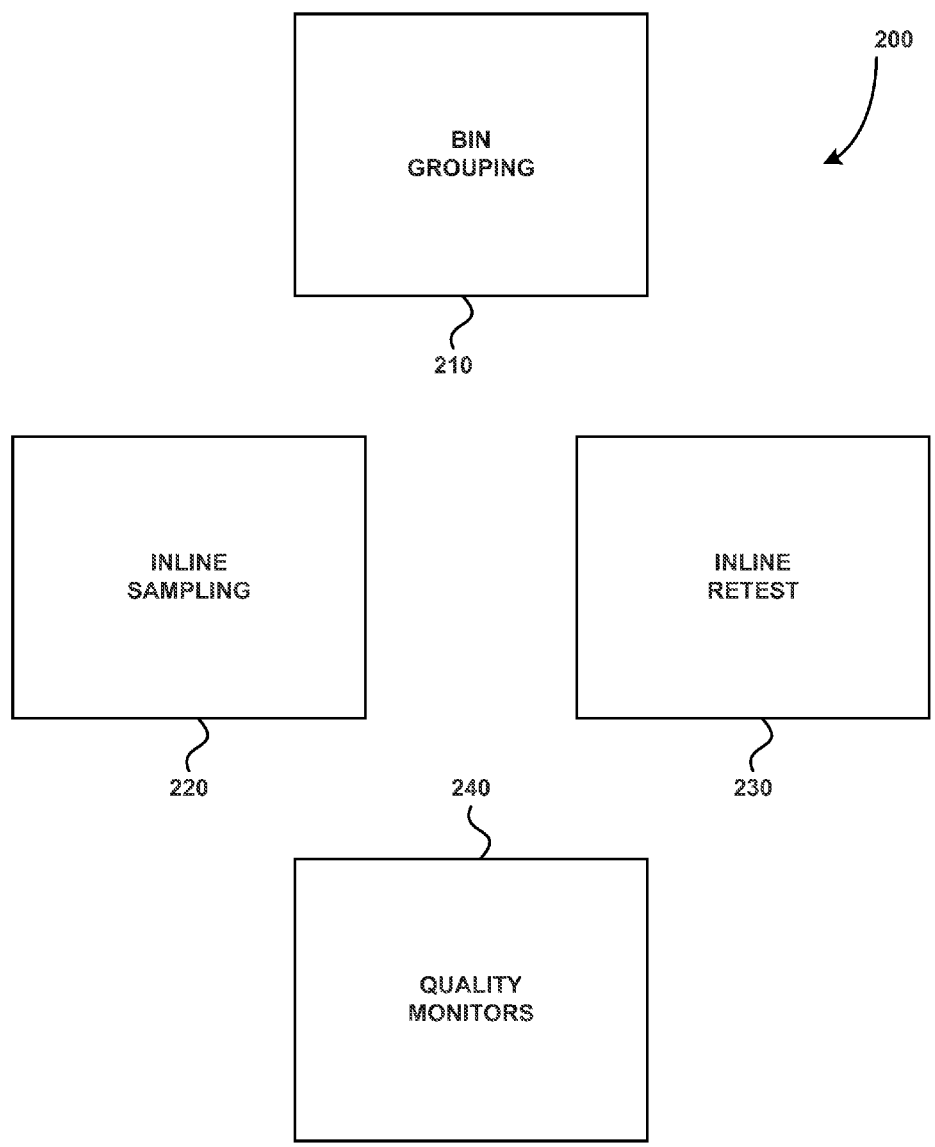
FIG. 2 illustrates four components of an integrated circuit quality assurance (QA) system, in accordance with one embodiment.

FIG. 2 illustrates four components of an integrated circuit quality assurance (QA) system 200, in accordance with one embodiment. The system includes a bin grouping component 210, an inline sampling component 220, an inline retest component 230, and a quality monitors component 240.

In one embodiment, the in-line sampling component 220 may sample from a plurality of groups of integrated circuits for semiconductor-related QA purposes. In various embodiments, the sampling may be in-line, be performed in real-time or near-real-time, etc. As an option, the groups of integrated circuit may be positioned in a tray. In the context of the present description, a tray may include any container for sampled integrated circuits. In addition, a sample may include any one or more integrated circuits selected from a group of integrated circuits.

In use, the in-line sampling component 220 may provide for in-line semiconductor-related testing. By virtue of the real-time or near-real-time sampling mentioned above, the in-line semiconductor-related testing may, in one embodiment, be performed in real-time or near-real-time. Still yet, the in-line sampling component 220 may output results of semiconductor-related testing prior to finishing results of testing associated with a group.

Furthermore, in one embodiment, the quality monitors component 240 may stop a semiconductor-related test based on predetermined criteria indicative of one or more testing problems. Additionally, in another embodiment, testing data may be integrated from a plurality of different data sources associated with semiconductor-related testing.

Additionally, in one embodiment, the inline retest component 230 may provide for in-line re-testing for semiconductor-related QA purposes. Further, the inline retest component 230 may provide such re-testing on a real-time or near-real-time basis. Still yet, in another embodiment, the inline retest component 230 may output results of semiconductor-related re-testing prior to finishing results of testing associated with a group of integrated circuits. In use, any integrated circuits that fail the aforementioned testing may be subjected to the re-testing. In addition, the inline retest component 230 may optimize retesting based on feedback received from other testing and/or retesting.

In yet another embodiment, the bin grouping component 210 may be used to map one or more bin groups to one or more handler bins. In use, a plurality of virtual bins may be defined. In the context of the present description, a bin group may include any grouping of bins. For example, in various embodiments, such grouping may be a physical grouping, a logical grouping, a virtual grouping, etc. Further, a handler may have a set number of predefined bins, or a configurable amount of bins.

In various embodiments, one or more of the aforementioned components e.g. the bin grouping component 210, inline sampling component 220, inline retest component 230, quality monitors component 240, etc.) may be integrated together, and/or used together in any combination. Furthermore, any of the components may be used with or without incorporating the other components.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Inline Sampling

Figure 3:
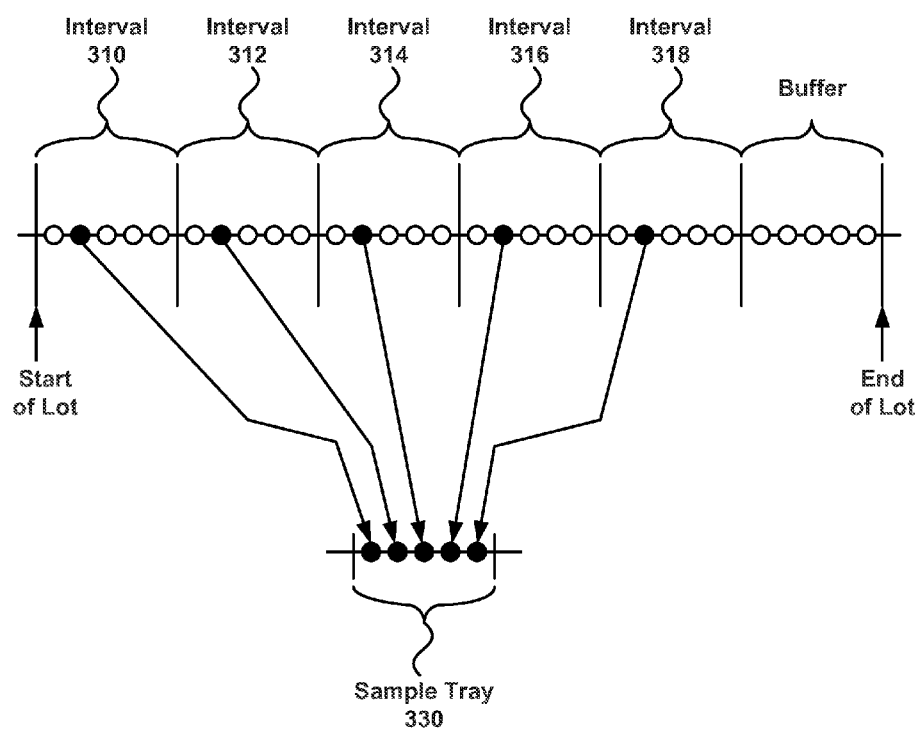
FIG. 3 illustrates a system for performing inline sampling, in accordance with one embodiment.

FIG. 3 illustrates a system for performing inline sampling, in accordance with one embodiment. As shown, inline sampling is automatically performed during a first test pass. The first test pass may perform sample sorting on user designated sample bins, and may assign a new sort bin value to the unit. In one embodiment, the sampling intervals 310, 312, 314, 316, and 318 may be equally split, such that the sampled integrated circuits are spread evenly across a lot. Further, at the end of the test pass, the sampled integrated circuits are gathered in a single tray 330, as shown.

In one embodiment, the inline sampling may allow for sample bin retesting during the sample sorting. This sample bin retesting may result in the sampled integrated circuits being output in pass or fail trays. Such trays may or may not correlate to the size of a bin. By combining QA with the first test pass, human errors may be reduced and the throughput may be increased.

In another embodiment, the inline sampling may be spread across the entire lot, which may reduce the chance of overlooking quality issues. Further, in multi-site testing, the inline sampling may intelligently decide on sample integrated circuits across all sites, whereby integrated circuits tested in different sites are sorted evenly across the entire lot. Additionally, human handling problems may be minimized by automatically sorting sampled integrated circuits across the entire lot.

Moreover, in one embodiment, the QA test pass may be combined into the first test pass, thereby increasing throughput. Furthermore, in another embodiment, the inline sampling may directly sort the QA test pass and fail bins into the respective tray. In another embodiment, the inline sampling may determine the sample size based on a percentage of the lot size.

Figure 4:
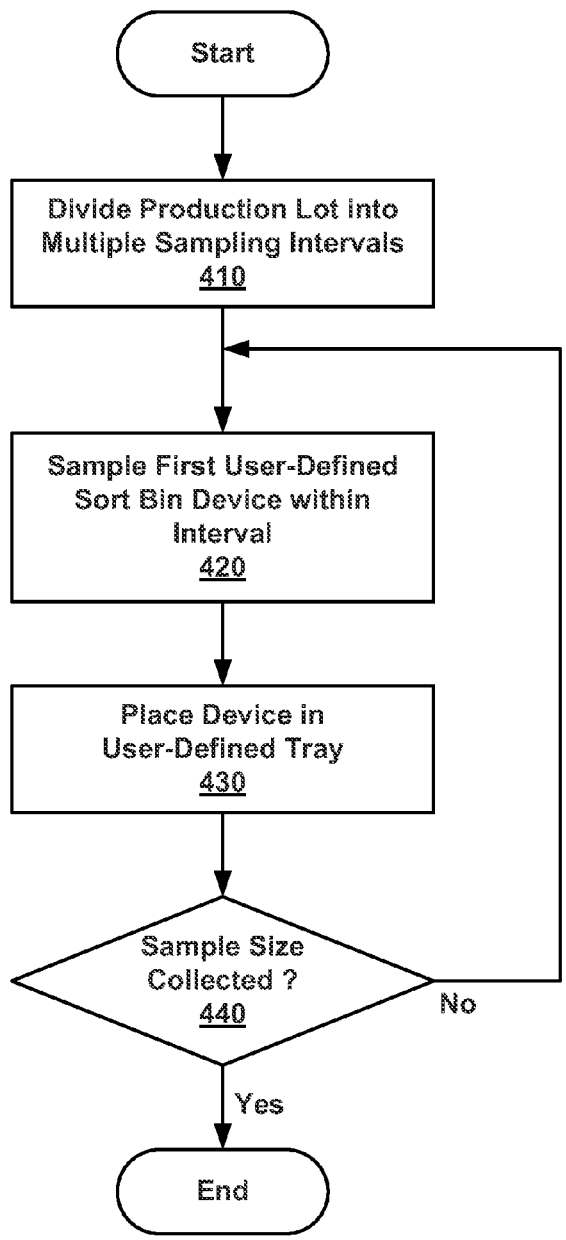
FIG. 4 illustrates an inline sampling algorithm, in accordance with one embodiment.

FIG. 4 illustrates an inline sampling algorithm, in accordance with one embodiment. As shown, an inline sampling algorithm first divides a production lot into multiple sample intervals according to user-definable setups. See operation 410. The total number of intervals equates to the sample size. Further, in each interval, the first user defined sort bin device is sampled. See operation 420. The sampled integrated circuit is then placed into a user defined tray, as noted in operation 430. As shown, operations 420 and 430 continue until a sample size has been reached, as noted in decision 440.

For example, an integrator may be used to set up file settings to indicate a lot size of 36, and a sample size of 5. With these settings, the interval size is calculated as: real $[36/(5+1)]=6.0$. The sampling point is calculated as: real $[iStep*interval\ size]$, where the iStep is incremental from 0, 1, 2, 3, etc. In this example, the sampling point is calculated as: real $[iStep*6]=0, 6, 12, 18, 24$, etc.

Figure 5:
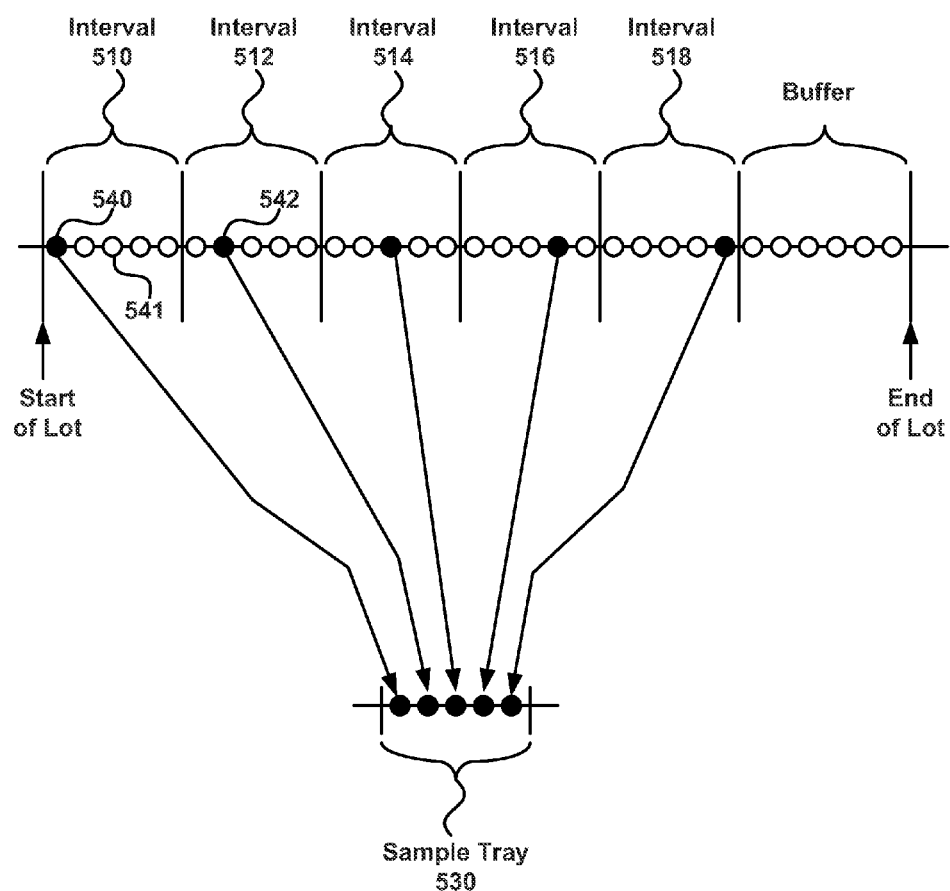
FIG. 5 illustrates a system for inline sampling, in accordance with one embodiment.

FIG. 5 illustrates a system for inline sampling, in accordance with one embodiment. As shown, an integrator may sample a first user defined bin 540. After the integrator has sampled an integrated circuit 540, the integrator may wait until a next interval 512 to sample a next integrated circuit 542. If the next integrated circuit to be sampled is not in a user defined bin, the integrator may continue until it locates a user defined bin for sampling. This sampling process continues for the remaining intervals 514, 516, 518 until all of the necessary integrated circuits are collected and placed into a sample tray 530.

In another embodiment, quad-site inline sampling may used in order to collect all sample integrated circuits equally from every test site. In use, the quad-site inline sampling may designated to take integrated circuits from site 0, site 1, etc.

Figure 6:
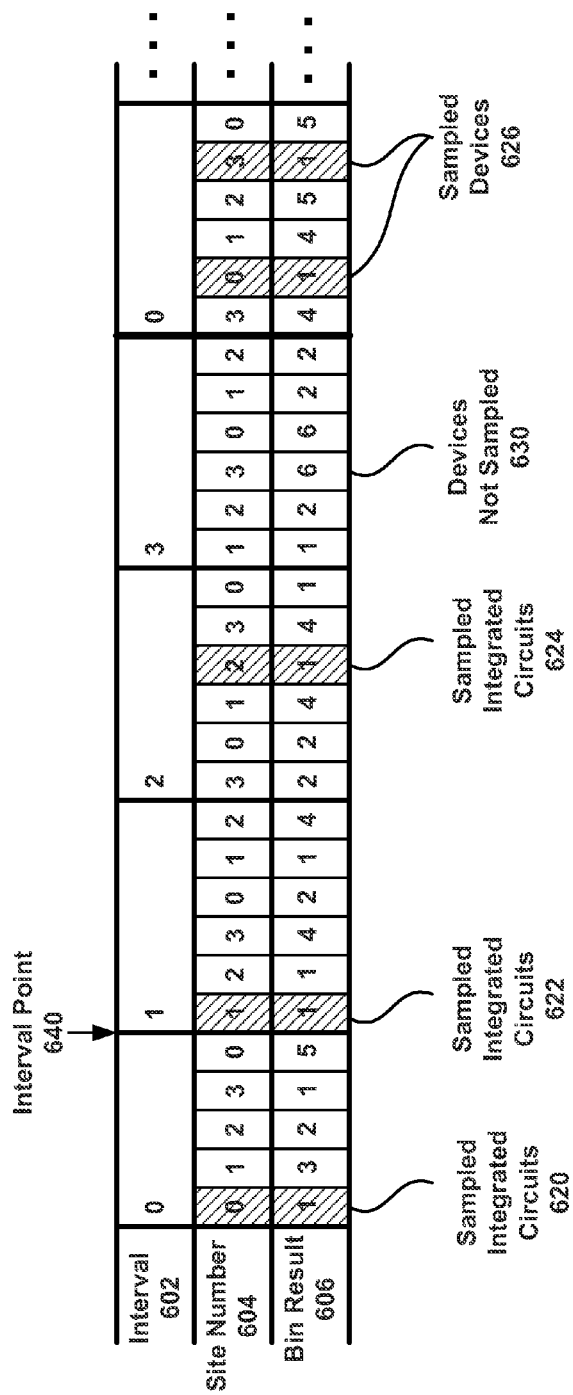
FIG. 6 illustrates a method of quad-site sampling, in accordance with one embodiment.

FIG. 6 illustrates a method for quad-site sampling, in accordance with one embodiment. As shown, the quad-site sampling is performed during each interval 602, at a plurality of sites (each with a site number 604), and at user defined sample points with the binning results. In the illustrated example, the selected bin result=1. As illustrated in FIG. 6, during interval 0, one or more sampled integrated circuits 620 are taken for site number 0 from the selected bin result 1. In the next interval, the sampled integrated circuit(s) 622 is taken for site number 1 from the selected bin result 1. In the following interval, the sampled integrated circuit(s) 624 is taken for site number 2 from the selected bin result 1. However, in the third interval, an integrated circuit is not sampled (see item 630) since site 3 does not have bin result 1. With continuing reference to FIG. 6, in the following interval, a sampled integrated circuit(s) 626 is taken for site number 3 from selected bin result 1, and for site number 0 from selected bin result 1. Therefore, in the fifth interval, two sample integrated circuits are collected.

In yet another embodiment, the sampled integrated circuit(s) is collected from the first user selected bin in each interval. The collecting of samples may occur until the target sample size is reached. Furthermore, multiple selected bins may be configured for sampling, which may be useful for tracking multiple designated bins.

In one embodiment, inline sample retesting may be performed. During inline sample retesting, an integrator may perform inline retesting on the sampled integrated circuits. For instance, the inline sampling provides the additional capability of retesting every sample integrated circuit as soon as the integrated circuit is recognized as a sample bin result. As an option, in the case of a sample retest failure, a new bin value may be assigned according to the configuration settings established during integrator setup.

It should be noted that there are many methods for configuring sample size to meet user requirements. For example, a minimum sample size (based on the number of integrated circuits) may be used to indicate a minimum number of integrated circuits in a lot to sample. Additionally, a minimum sample size (based on the percentage of a lot) may be used to indicate the minimum percentage of integrated circuits in a lot to sample. Furthermore, the number of integrated circuits and percentage of a lot may be compared to each other, whereby the greater of the two numbers may be used as a minimum sample size.

For example, assume a particular lot has a lot size of 10,000 integrated circuits. The integrator may be configured with a sample size based on a number of integrated circuits=200, and a percentage of a lot=5%. In this configuration example, 5% of 10,000 integrated circuits equates to 500 integrated circuits. Therefore, since the percentage of the lot is greater than the number of integrated circuits, the 500 figure is used for the sample size.

In addition, a number of custom sample size entries may be configured, since lot sizes generally vary from one lot to another. In one embodiment, the integrator provides for configuration of a variety of lot sizes. Table 1 illustrates a variety of configured lot sizes in accordance with the present example.

TABLE 1

| Lot Size | Sample Size |
| --- | --- |
| 0-1000 integrated circuits | 100 sample integrated circuits |
| 1001-5000 integrated circuits | 200 sample integrated circuits |
| 5001-10,000 integrated circuits | 300 sample integrated circuits |
| 10,000-20,000 integrated circuits | 400 sample integrated circuits |

Additionally, if custom sample size entries are configured, the settings and parameters for a number of integrated circuits and percentage of a lot may be superseded.

In another embodiment, an inline sample retest monitor may be provided. For example, during the inline sample retest, results for the inline sample retest can be configured for monitoring. In use, the integrator may monitor a maximum retest deviation. Furthermore, if a retest deviation value exceeds the maximum retest deviation, the inline sample retest monitor may be triggered. The retest deviation may be calculated as a total number of integrated circuits that failed the inline sample retest, divided by a total number of integrated circuits that were subjected to the inline sample retesting.

Figure 7:
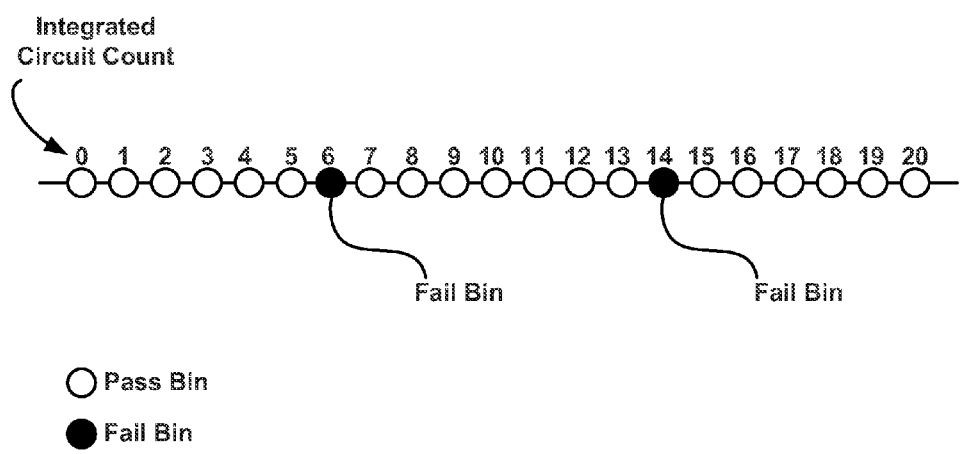
FIG. 7 illustrates the triggering of an inline sample retest monitor, in accordance with one embodiment.

FIG. 7 illustrates the triggering of an inline sample retest monitor, in accordance with one embodiment. As shown, an inline sample retest is performed on 20 integrated circuits. The maximum retest deviation is set to 5%. In the illustrated example, 2 integrated circuits are shown to fail the inline sample retest. Thus, in order to calculate the retest deviation, the 2 failed integrated circuits are divided by the 20 tested integrated circuits, which equals 0.10, or 10%. Since the retest deviation of 10% exceeds the maximum retest deviation of 5%, an inline sample retest monitor may be triggered.

Inline Retest

Figure 8:
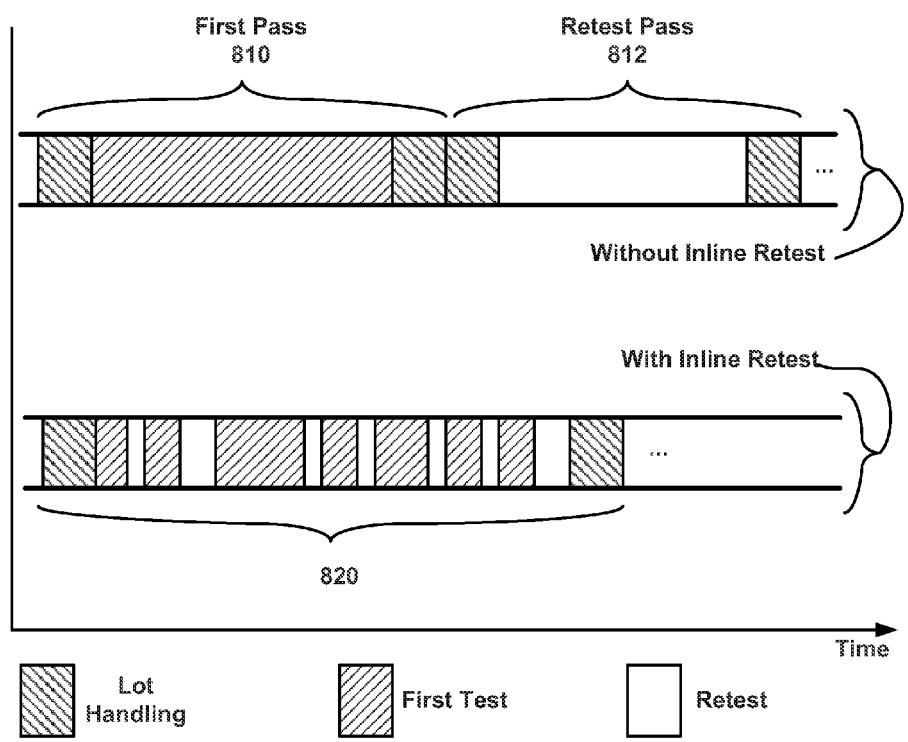
FIG. 8 illustrates a method for performing an inline retest, in accordance with one embodiment.

FIG. 8 illustrates a method for performing an inline retest, in accordance with one embodiment. As shown, inline retest executes an integrated circuit retest immediately upon completion of the first tests without placing the integrated circuit into the output tray. The integrated circuits are placed into the output tray only after the completion of the retest. As such, the first pass 810 and the retest pass 812 may be combined into one single pass 820, thereby eliminating lot handling times associated with the retest pass 812. The lot handling time refers to the amount of time necessary to setup a lot for testing.

In one embodiment, the time for a handler to move a unit from the input tray to the socket may be about 1 second. Further, when inline retesting, the typical time to lift an integrated circuit from the socket, and re-insert into the socket takes 500 ms or less. Since the test and retest takes place in a serial manner, a correlation between the first test result and the retest result for that integrated circuit is available.

In still yet another embodiment, the inline retest may allow for the elimination of an independent secondary retest pass. Optionally, this elimination may reduce operation overhead involving human operators, lot handling, etc. Furthermore, the integrator may allow for all designated retest bins to be assigned to one single re-grip bin. For example, when the integrator recognizes the retest bin, it may reassign the single retest bin to the handler.

Figure 9:
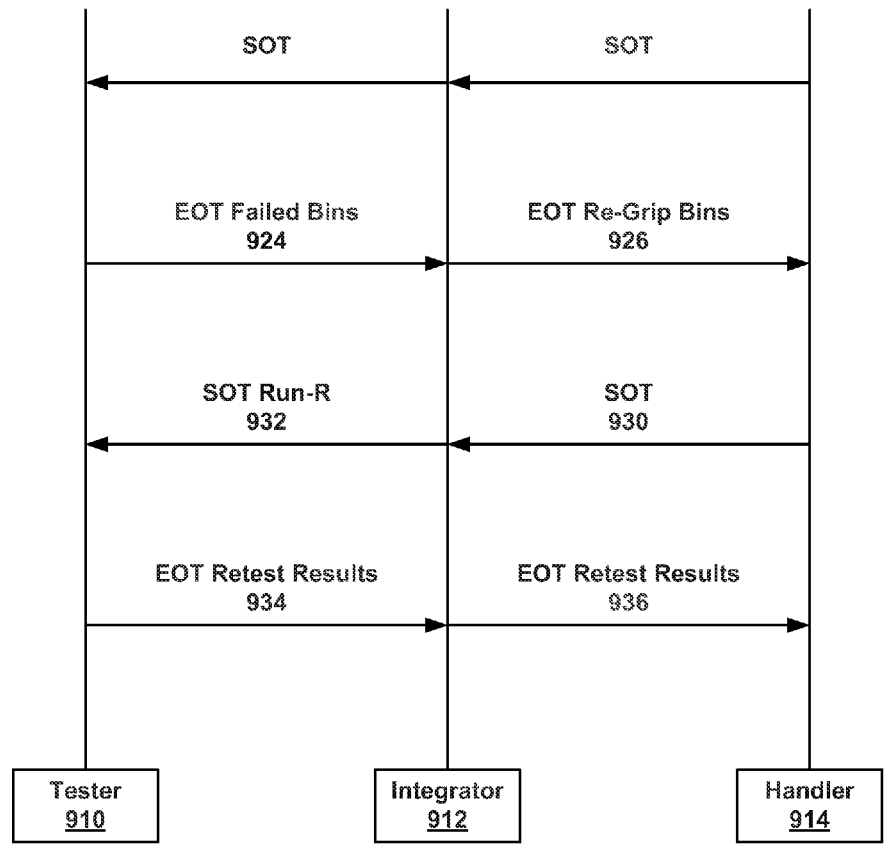
FIG. 9 illustrates a system for performing an inline retest, in accordance with one embodiment.

FIG. 9 illustrates a system for performing inline retesting, in accordance with one embodiment. In use, user defined retest strategies and parameters may be provided to an integrator 912. Such user defined parameters may be defined in integrator setup files associated with the integrator 912. In one embodiment, a navigator application may be used to generate the integrator setup files based on user input. The navigator application may be represented as a graphical user interface, a hardware interface, etc. As an option, the navigator setup file may be centrally managed. Optionally, a single handler re-grip bin may be defined in the integrator 912, such that each time the integrator 912 detects inline retest bins, it may send only a single bin signal for each handler re-grip command.

During the test, the integrator 912 captures inline retest hard and soft bin results (see operation 924) in accordance to the settings and parameters defined in the integrator setup files. The integrator 912 then sends an end of test (EOT) re-grip bins signal (see operation 926) to a handler 914 for bin re-grip. Further, the handler 914 sends a start of test (SOT) signal (see operation 930) to the integrator 912. Next, the integrator 912 sends the SOT signal with the "Run-R" signal (see operation 932) to a tester 910.

The tester 910 recognizes that it is retesting an integrated circuit via the "Run-R" signal. Further, the tester 910 notes the result file, and automatically reconciles the part count. Next, the tester 910 sends the EOT retest result (see operation 934) to the integrator 912, which then sends the EOT retest result (see operation 936) to the handler 914. Finally, the handler 914 sorts the EOT retest result into the appropriate handler bin.

Figure 10:
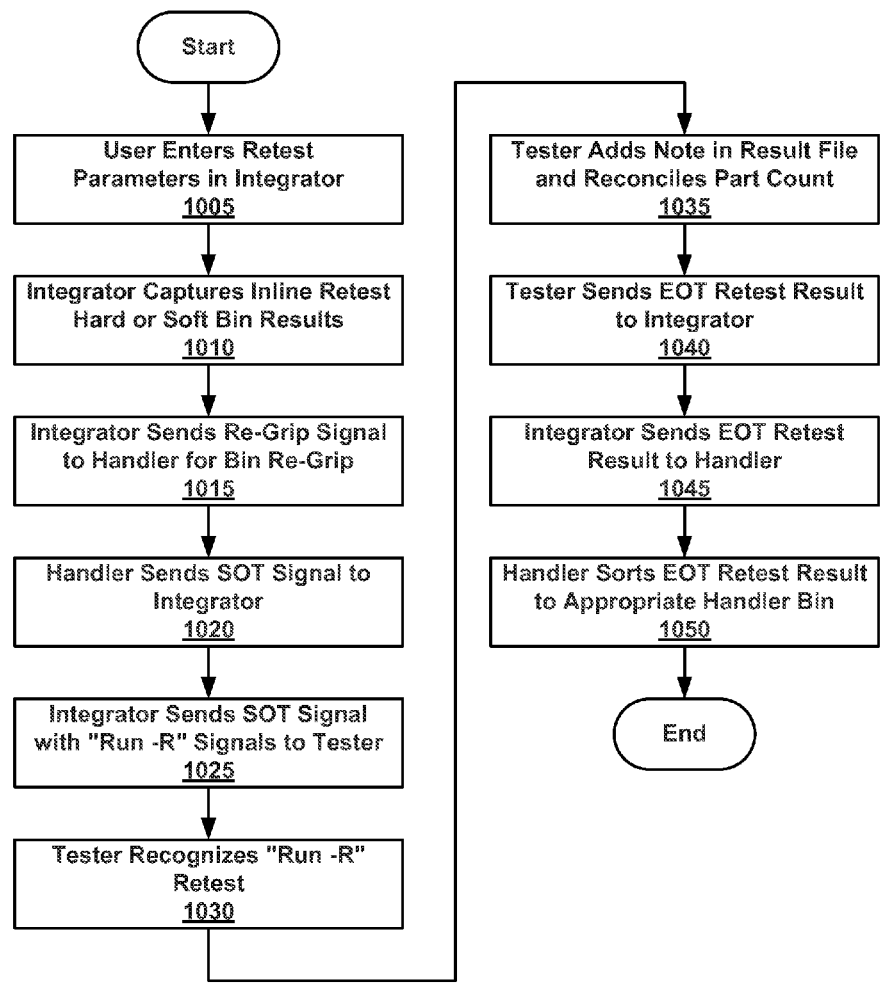
FIG. 10 illustrates a method for performing an inline retest, in accordance with one embodiment.

FIG. 10 illustrates a method for performing an inline retest, in accordance with one embodiment. First, a user enters the retest information into an integrator. See operation 1005. Next, the integrator captures the inline retest hard or soft bin results. See operation 1010 Further, as noted in operation 1015, the integrated then sends a re-grip signal to a handler for bin re-grip. The handler then sends a SOT signal to the integrator. See operation 1020 The handler then sends the SOT signal along with the "Run-R" signal to the tester, as indicated in operation 1025.

Next, the tester recognizes the "Run-R" retest signal. See operation 1030. Following the retest, the tester adds a note in a result file and reconciles a part count. See operation 1035. For example, the note may indicate a result of the retest, time of the retest, and/or other information associated with the retest. Next, the tester sends the EOT retest result to the integrator. See operation 1040. The integrated then sends the EOT retest result to the handler, as indicated in operation 1045. Finally, the handler sorts the EOT retest result to the appropriate handler bin. See operation 1050.

The inline retest may be configured and optimized for different scenarios in order to address different strategies. For example, one such scenario involves a normal inline retest. The normal inline retest represents a straightforward, on-the-fly retest of user-designated retest bins. The user is allowed to define hard and soft retest bin lists and a single retest bin assignment on the handler. This test is designed to maximize yield by retesting all designated test bins. Thus, by merging the first pass and the retest pass, the cycle time and lot handling time are reduced.

For example, the integrator is configured via the integrator final test setup files with bin 9 as the single handler re-grip bin, and bins 0 and 2-8 as the retest bins. In use, the testing binning result is in bin 5, and according to the setup file, bin 5 should be retested. The integrator then changes bin 5 to bin 9, and sends the integrated circuit to the handler. Instead of sorting the integrated circuit into a tray, the handler sends the SOT signal to the integrator. The tester then retests the integrated circuit with the result bin 1. Further, the tester sends bin 1 to the integrator, and the handler puts the integrated circuit into tray 1.

Another such scenario where configuring and optimizing the inline retest may be useful involves a dynamic inline retest. In use, such dynamic inline retest may help to fine-tune the inline retest between yield and throughput. In a dynamic inline retest, the inline retest may be turned on and off based on a pre-defined yield limit. For example, during a lot run, if the yield is higher or lower than a specified limit, the inline retest may be automatically disabled. If the yield falls between the user defined yield ranges, the inline retest may be resumed until the yield goes beyond the yield threshold. Thus, the dynamic inline retest optimizes for yield initially, and then for throughput.

Users are able to define the maximum and minimum yield for the retest using a navigator application. Defining a maximum and minimum yield allows for the inline retest to be enabled only when the yield for the lot run is within a user defined total yield range. In addition, the user is allowed to define the start value used to start monitoring after the number of integrated circuits. For example, a user may set a yield range for enabling inline retest from 70% to 90% after 100 integrated circuits has been reached. Thus, for the first 100 integrated circuits, no inline retest is performed, and for the one-hundred-and-first integrated circuit onwards, the inline testing may be performed if the yield range is between 70% and 90%.

Another such scenario where configuring and optimizing the inline retest may be useful involves a bin recovery based inline retest. For example, bin recovery-based inline retesting may be used to fine tune the inline retest by intelligently retesting only those bins with a sufficiently high recovery rate, thus improving the overall efficiency. In one embodiment, the bin recovery-based inline retesting may segment a lot with a user defined number of units.

For instance, the first N units of the segment may be tested and retested, and a recovery rate may be obtained on a per-bin basis. After N units, the rest of the units of the segment are selectively retested based on the bin yield recovery statistics. Thus, only those bins with a sufficiently high recovery rate are retested, and any bins not meeting the recovery limit are excluded from the retest. Optionally, the recovery limit may be set by the user using the navigator application, for example. After the current segment completes, the first N units from the next segment are tested and retested to collect a fresh per-bin recovery rate for use in the segment.

For example, a user may configure the sampling frequency as 1000 integrated circuits, the sample size as 100 integrated circuits, and a minimum recovery yield of 21%. For the first segment of a bin, the first 100 integrated circuits are sampled and retested, resulting in a 33% recovery rate. Since the target 21% recovery rate has been satisfied, the remaining integrated circuits 101-1000 may be tested using inline retesting. For the second segment of the bin, the first 100 integrated circuits (1001-1100) are sampled and retested, resulting in a 9% recovery rate. Since the 9% recovery rate is less than the target 21% recovery rate, the remainder of this segment is tested without inline retest. This process continues through all segments in the lot.

Yet another such scenario where configuring and optimizing the inline retest may be useful involves a dynamic multi-site inline retest. Such dynamic multi-site inline retest helps balance the retest yield against the cost of multi-site inline retest. The users may be allowed to configure the inline retest based on a matrix of the number of sites failed, and the maximum and minimum yield totals, thereby improving the overall retest efficiency.

For example, the user may configure the multi-site inline retest parameters using the navigator application. In the context of multi-site testing using 4 sites, the decision to perform a retest depends on the percentage of sites failed in each test cycle. Table 2 illustrates the multi-site inline retest parameters in accordance with the present example.

TABLE 2

| Entry | % of Sites | Max Yield % | Min Yield % |
|---|---|---|---|
| $1^{st}$ Entry | 100 | 88 | 80 |
| $2^{nd}$ Entry | 75 | 87 | 80 |
| $3^{rd}$ Entry | 50 | 85 | 80 |
| $4^{th}$ Entry | 25 | 80 | 80 | accordance with the present example, of the first 4 integrated circuits of a lot in the first test cycle, 3 of the sites failed, resulting in a 75% site failure rate. The integrator may compare the current yield with the user defined values and, if the yield range is within 80% to 87%, perform the retesting cycle.

Inline Sample Retest

Figure 11:
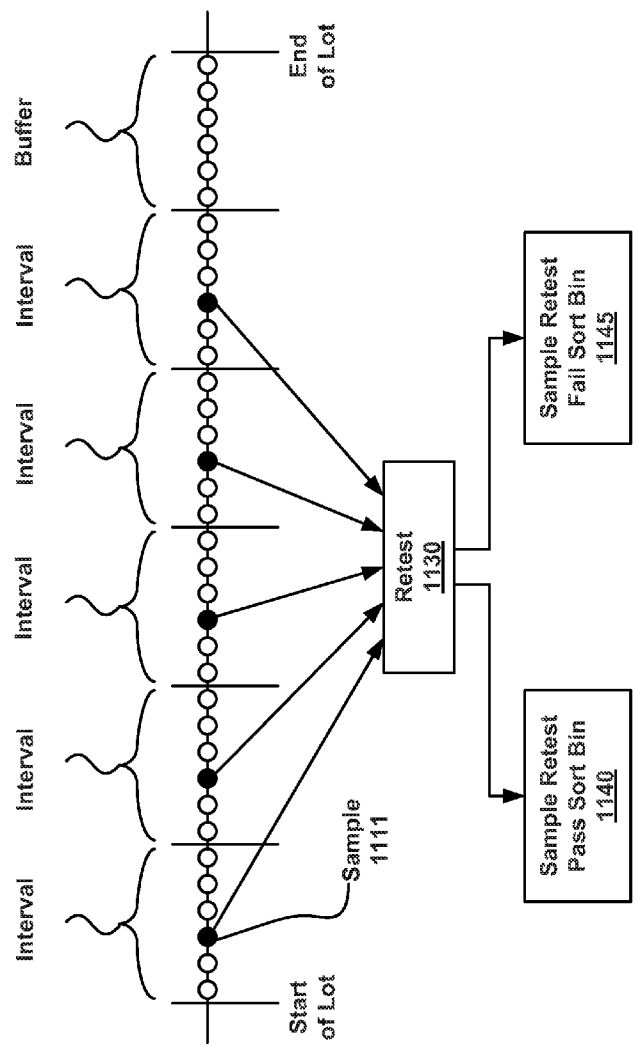
FIG. 11 illustrates a method for an inline sample retest, in accordance with one embodiment.

FIG. 11 illustrates a method for inline sample retesting, in accordance with one embodiment. As shown, an inline sample retest is a combination of inline sampling and inline retesting. The sampling 1111 on user designated sample bins is automatically performed. Further, the sample's retest 1130 is executed upon the completion of the first test of each integrated circuit without sorting the integrated circuits onto the appropriate output trays. At the end of the retest of a sampled integrated circuit, the retested sampled integrated circuit may be output to a sample pass tray 1140 or a sample fail tray 1145.

In one embodiment, the QA integrated circuits are picked evenly across the entire lot in order to reduce overlooked quality issues. Further, in another embodiment, the sample integrated circuits are automatically sampled and tested across the entire lot to reduce human handling issues. Still yet, in another embodiment, the QA pass is combined into the first pass in order to increase throughput, and the inline sample retest directly sorts the QA passed and failed bins to their respective trays.

Figure 12:
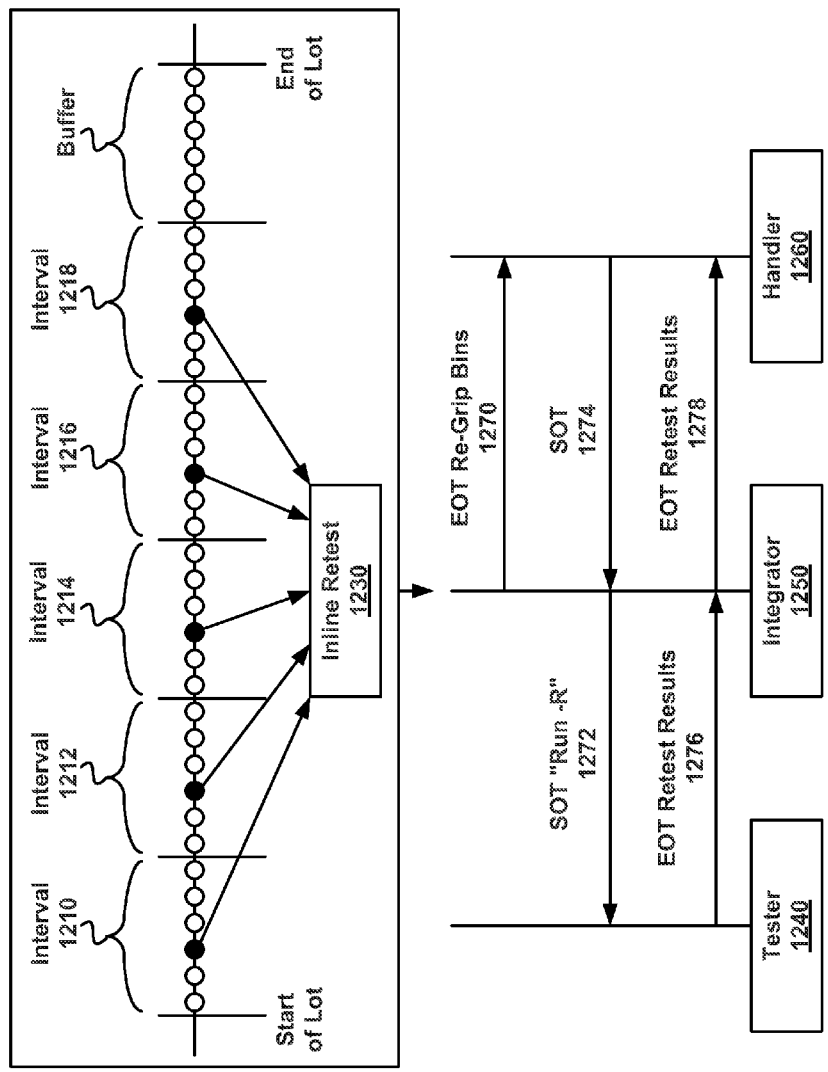
FIG. 12 illustrates a system for an inline sample retest, in accordance with one embodiment.

FIG. 12 illustrates a system for inline sample retesting, in accordance with one embodiment. As shown, a production lot is divided into multiple intervals 1210, 1212, 1214, 1216, and 1218 according to user-definable setups. The total number of intervals equals the sample size. Next, in each interval, the first user defined sort bin integrated circuit is sampled for inline retesting 1230.

An integrator 1250 sends a re-grip signal (see operation 1270) to a handler 1260 for bin re-grip. Further, the handler 1260 sends a SOT signal (see operation 1274) to the integrator 1450 which, in turn, sends the SOT signal along with the "Run-R" signal (see operation 1272) to a tester 1240. The "Run-R" signal is a function call so that the tester 1240 recognizes that it is retesting an integrated circuit. Optionally, the tester 1240 may note the result file, and automatically reconcile the part count. Next, the tester 1240 sends the EOT retest result (see operation 1276) to the integrator 1250 which, in turn, sends the EOT retest result (see operation 1278) to the appropriate handler bin. This process is repeated for each interval until the designated sample size has been successfully collected.

Figure 13:
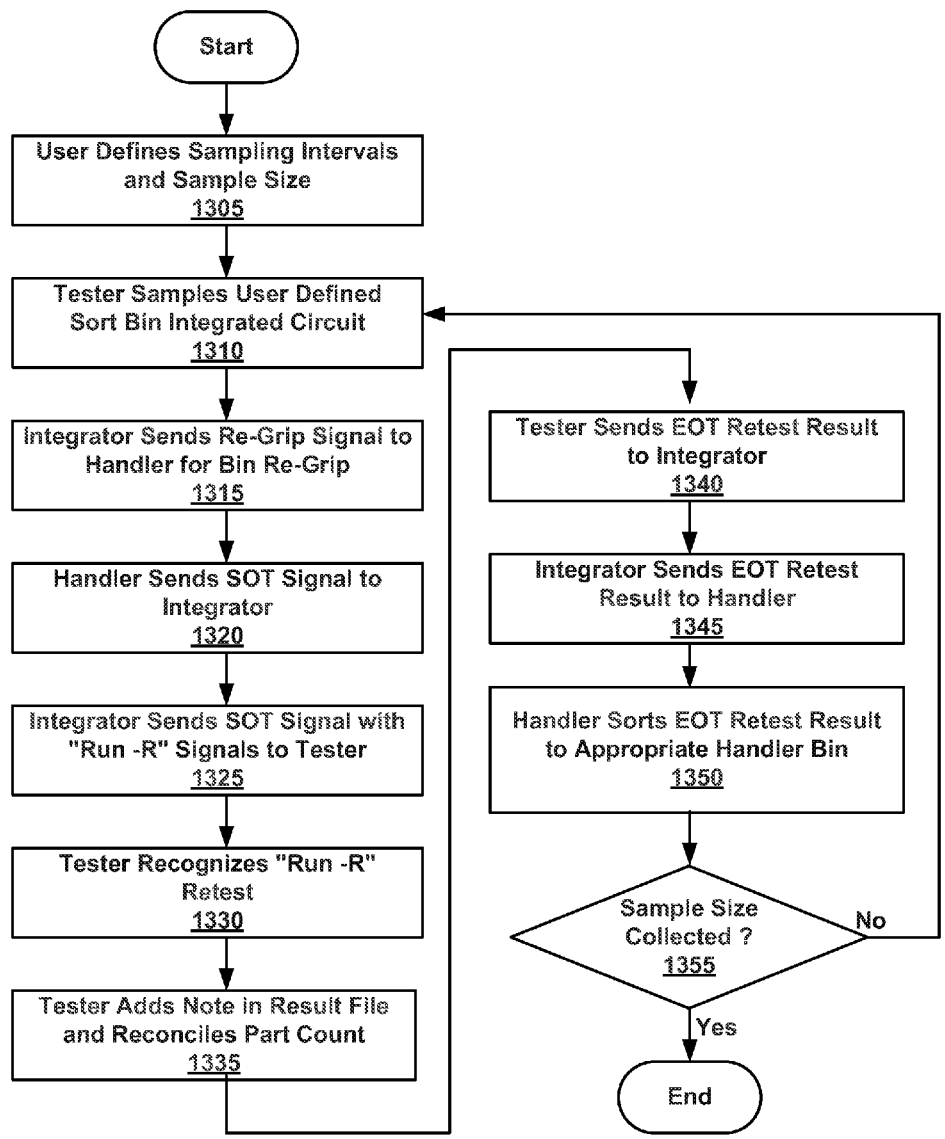
FIG. 13 illustrates a method for an inline sample retest, in accordance with one embodiment.

FIG. 13 illustrates a method for inline sample retesting, in accordance with one embodiment. First, a user defines sampling intervals and a sampling size. See operation 1305. Further, a tester samples a user defined sort bin device. See operation 1310. Next, the integrator sends the re-grip signal to the handler for bin re-grip. See operation 1315. Further, the handler then sends the SOT signal to the integrator (see operation 1320), and the integrator then sends the SOT signal along with a "Run-R" signal to the tester. See operation 1325.

The tester recognizes the "Run-R" signal as a retest. See operation 1330. The tester then adds a note in the result file, and reconciles the part count. See operation 1335. Subsequently, the tester sends the EOT retest result to the integrator (see operation 1340), and then the integrator sends the EOT retest result to the handler. See operation 1345. Finally, the handler sorts the EOT retest result to an appropriate handler bin. See operation 1350. This procedure is repeated until the designated sample size has been collected. See decision 1355.

For example, utilizing a navigator application, an inline sample retest single handler re-grip bin may be set to bin 9, a pass bin set to bin 11, a fail bin set to bin 12, and a minimum sample size set to 200 integrated circuits. For a lot of 1000 integrated circuits, one sample integrated circuit is taken from approximately 5 intervals. As soon as the integrator recognizes a bin as a sample bin, the sample integrated circuit may be retested, and placed into the pass bin 11, or the fail bin 12.

In yet another embodiment, the integrator may implement an inline sample retest monitor. For example, in a QA retest pass, more concern is placed on the integrated circuit failure rate, since QA is expected to have almost all passing integrated circuits. Therefore, the integrator monitors maximum retest deviation, which is calculated via the following formula: retest deviation=total inline sample retest failed integrated circuits/by total inline sample retest integrated circuits. The inline sampled retest monitor may be triggered if the retest deviation value exceeds the parameter for maximum retest deviation.

Figure 14:
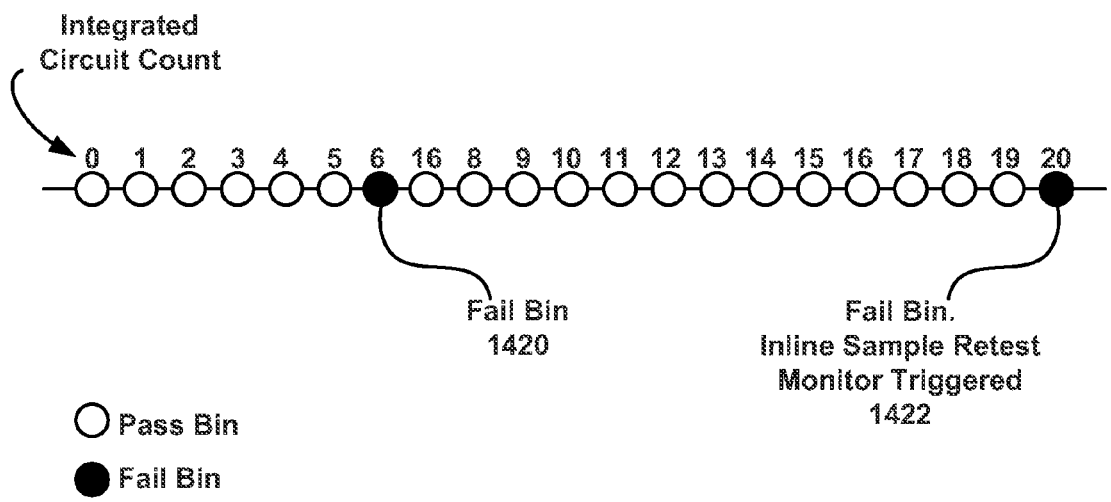
FIG. 14 illustrates an example of an inline sample retest, in accordance with one embodiment.

FIG. 14 illustrates an example of inline sample retesting, in accordance with one embodiment. In the present example, there are 20 sample integrated circuits to retest, and a max retest deviation parameter of 5%. In retesting, two integrated circuits 1420, 1422 failed the retest and were placed in a fail bin. The second device failure 1422 triggered an inline sample retest monitor, since 2 of 20, or 10%, of the integrated circuits failed the retest, which exceeds the max retest deviation parameter of 5%.

Bin Group to Hard Bin Monitoring

In one embodiment, an integrator may be equipped with a bin group to handling bin mapping feature to provide the user with a mechanism for mapping several tester hard bins (e.g. bin group) into a single handler sort bin, and therefore use a lesser number of handler bins. In one embodiment, the bin group to hard bin mapping is able to group multiple bin numbers into a group, in order to support the limited number of hard bins supported by a handler, in some cases up to 16 (bins 0-15).

In another embodiment, the integrator may increase the number of hard bins that may be supported, and test program resources shared between the wafer test and the final test. Furthermore, in yet another embodiment, the bin group to handler bin mapping allows for additional hard bins for the purpose of sorting inline samples. Still yet, in another embodiment, a tester hard bin(s) to handler physical tray mapping may be configured via integrator setup files. In another embodiment, the handler mapping configurations of test results to physical trays may be standardized across an entire test floor.

In one embodiment, the bin group to handler bin mapping allows the integrator to assume the role of hard bin to physical tray mapping, by introducing the bin group in the middle. For example, the integrator handler bin mapping signal may be used in place of a hard bin number to communicate the test results to the handler.

Figure 15:
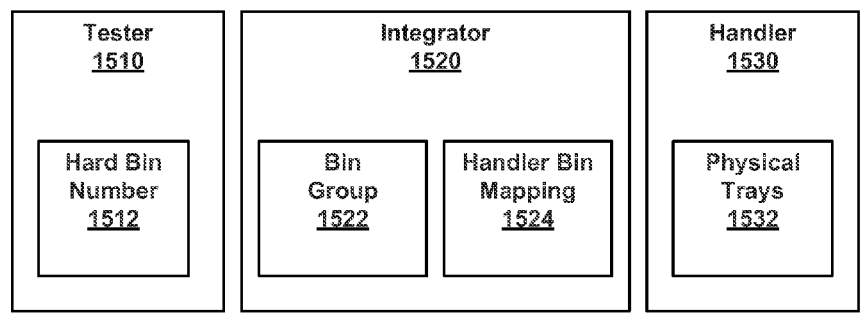
FIG. 15 illustrates a system for bin group to handler bin mapping, in accordance with one embodiment.

FIG. 15 illustrates a system for bin group to handler bin mapping, in accordance with one embodiment. As shown, the integrator provides bin group to handler bin mapping. For example, an integrator 1520 may control hander bin mapping 1524, and may directly send a final bin number to a handler 1530. Further, the integrator may group all tester hard bin numbers 1512 (associated with a tester 1510) into bin groups 1522 utilizing a bin code assignments section of a setup file. In one embodiment, the bin group may become equivalent to the handler physical tray 1532. In another embodiment, this feature may reduce a number of used handler bins to 16 while retaining a much larger number of valid tester bins.

Figure 16:
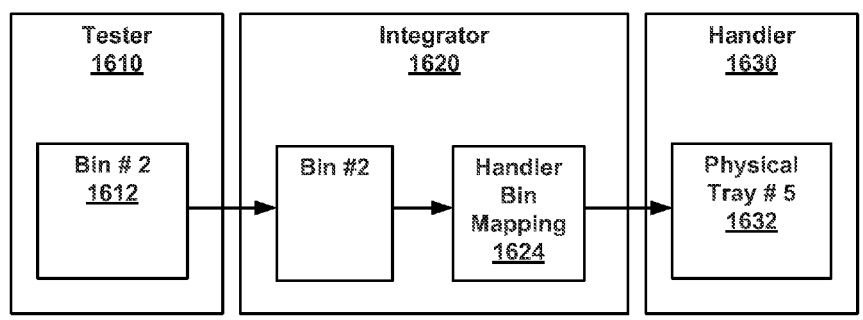
FIG. 16 illustrates a system for bin group to handler bin mapping, in accordance with one embodiment.

FIG. 16 illustrates a system for bin group to handler bin mapping, in accordance with one embodiment. As shown, a tester 1610 sends a binning signal. Next, an integrator 1620 analyzes a tester bin number 1612, and locates an appropriate bin group as configured by a navigator application. Next, the integrator 1620 performs bin group mapping. Furthermore, the integrator 1620 sends a handler bin mapping signal 1624 to the handler 1630. Finally, the handler 1630 assigns the handler bin mapping signal 1624 to a defined physical tray 1632.

Figure 17:
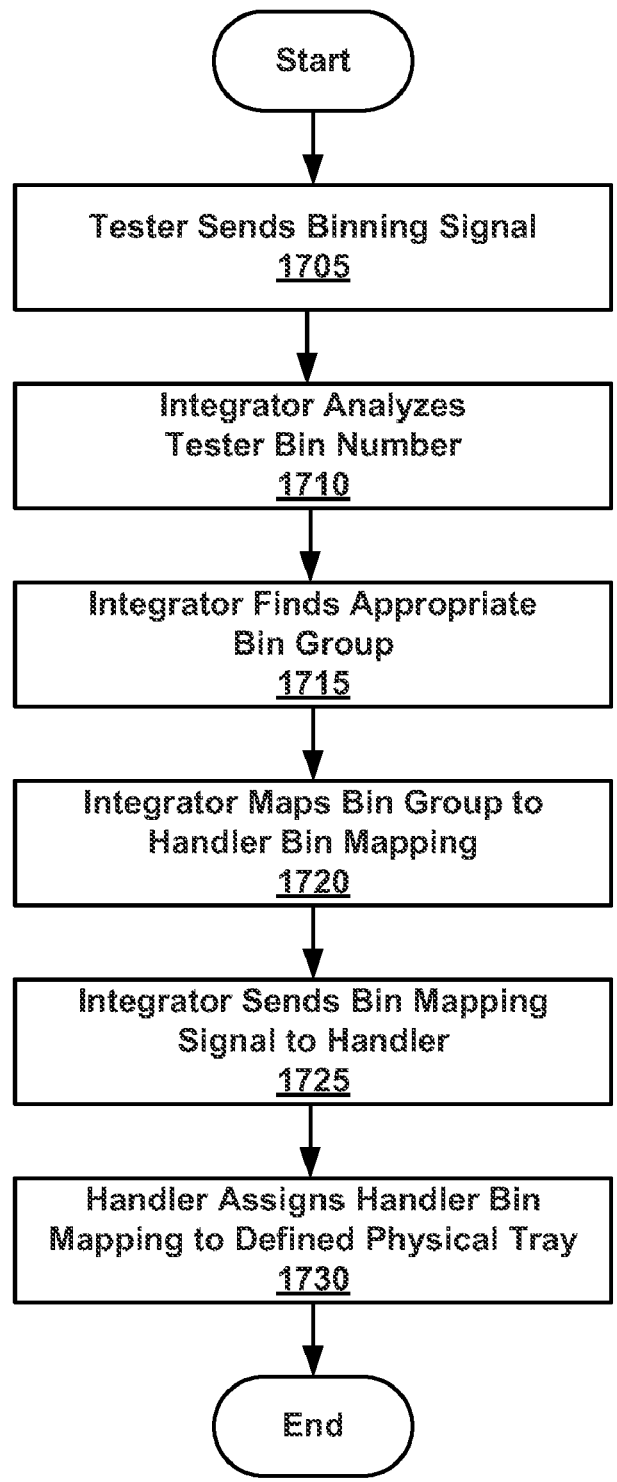
FIG. 17 illustrates a method for bin group to handler bin mapping, in accordance with one embodiment.

FIG. 17 illustrates a method for bin group to handler bin mapping, in accordance with one embodiment. First, the tester sends a binning signal to an integrator. See operation 1705. Next, the integrator analyzes the tester bin number (see operation 1710), and finds an appropriate bin group. See operation 1715. Further, the integrator maps the bin group to the handler bin mapping. See operation 1720. In addition, the integrator sends the bin mapping signal to the handler (see operation 1725), and the handler assigns the handler bin mapping to a defined physical tray. See operation 1730.

Three scenarios of use are provided below to illustrate the bin group to handler bin mapping. In the first scenario, navigator settings and parameters are defined in Table 3 in accordance with the present example.

TABLE 3

| Bin Group to Handler Bin Mapping Enabled |
| --- |
| Bin 2, 3, 4 = Group 2 |
| Group 2 = Handler Bin 5 |

In the current example, the tester sends the bin 2 signal to the integrator. The integrator analyzes bin 2, and finds that it belongs in bin group 2. Next, the integrator performs bin group 2 mapping into the handler bin 5, and sends the bin 5 to the handler. Finally, the handler then sorts the bin into tray 5.

In the second scenario, the navigator settings and parameters are defined in Table 4 in accordance with the present example.

TABLE 4

| Bin Group to Handler Bin Mapping Enabled |
| --- |
| Bin 11 = Group A |
| Bin 12 = Group B |
| Group A = Handler Bin 6 |
| Group B = Handler Bin 7 |
| Inline Sample Sort Enabled |
| Inline Sample Retest Enabled |
| Single-Handler Re-grip Bin = 15 |
| Sample Sort Pass Bin = 11 |
| Sample Sort Fail Bin = 12 |

In the current example, the Nth integrated circuit is tested or the first time and scheduled for sampling. The single handler re-grip bin 15 is sent to the handler to initiate sample retest. Next, if the sample retest fails, the sample sort fail bin 12 is used, which belongs in group B. Finally, group A bin number 7 is sent to the handler.

In the third scenario, the navigator settings and parameters are defined in Table 5 in accordance with the present example.

TABLE 5

| Bin Group to Handler Bin Mapping Enabled |
| --- |
| Bin 2, 3, 4 = Group 2 |
| Group 2 = Handler Bin 0 |
| Inline Retest Enabled |
| Retest Bin = 5 |
| No Single Re-grip Bin in Use |

In the current example, the integrator receives bin 5 as a result of the first test. Since no single handler bin is used, the tester bin 5 is sent to the handler due to no mapping for intermediate results. Next, the inline retest result is bin 2, which belongs in group 2 and represents the final result where mapping is used. Finally, group 2 bin number 0 may be sent to the handler.

Test Quality Monitoring

In one embodiment, an integrator may be adapted to introduce several different methods of quality test monitors. For example, these quality test monitors may be implemented as a mechanism that allows a user to control each yield monitor individually, thereby providing a fine tuning capability to the yield monitoring process.

Figure 18:
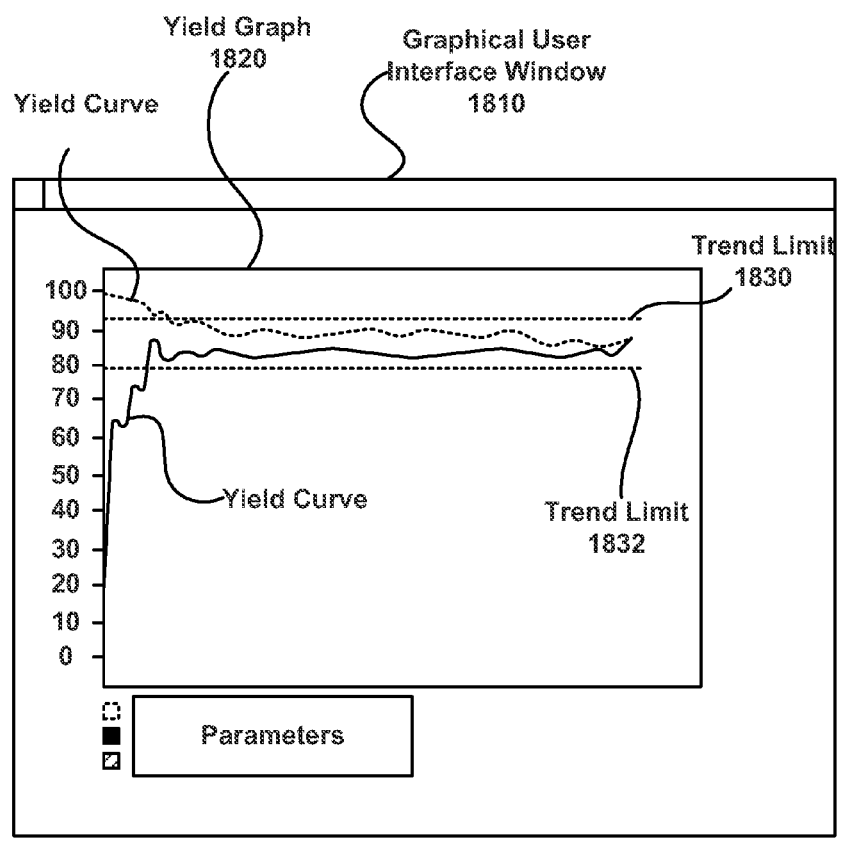
FIG. 18 illustrates a real-time lot running yield trend view, in accordance with one embodiment.

FIG. 18 illustrates a real-time lot running yield trend view, in accordance with one embodiment. As shown, the integrator is able to show the real-time lot running yield trend view 1820 for yield tracking purposes. The yield trend view 1820 may be displayed in a graphical user interface window 1810. Additionally, instead of only showing a current test yield, the integrator may allow the visualization of the overall test yield from the initial test integrated circuit to the current test integrated circuit. In another embodiment, the visualization is presented to the user in the form of a line graph In addition, the integrator may allow for user defined viewable yield trend limits 1830, 1832, which may be drawn in the yield trend line graph to assist users in determining the current status of the real-time yield line.

Furthermore, in yet another embodiment, test quality monitors may provide a real-time production pause. For example, the production may be paused when the test yield is over the pre-defined limits. In addition, in another embodiment, the test quality monitors may provide for immediate detections of potential lot and test cell quality issues. For example, a test cell may be a group of testers. Furthermore, user definable notification messages are provided to the operators and line support. In addition, the notification messages may include information on problem resolution.

Still yet, in another embodiment, the test quality monitors provide for both long term and user definable short term monitoring on yield trends. In addition, the monitoring may show the overall yield, and a yield for the last x tested integrated circuits. Furthermore, in one embodiment, the quality monitors may provide an alert of any drifting in multi-site test cell performance, by monitoring target yield limits on the separate sites and comparing the yield among all of the sites. In addition, the quality monitors may provide an alert upon a degradation of a selected bin or bins in test cell performance. Optionally, the alert may occur for continuous bin failures, as well.

Figure 19:
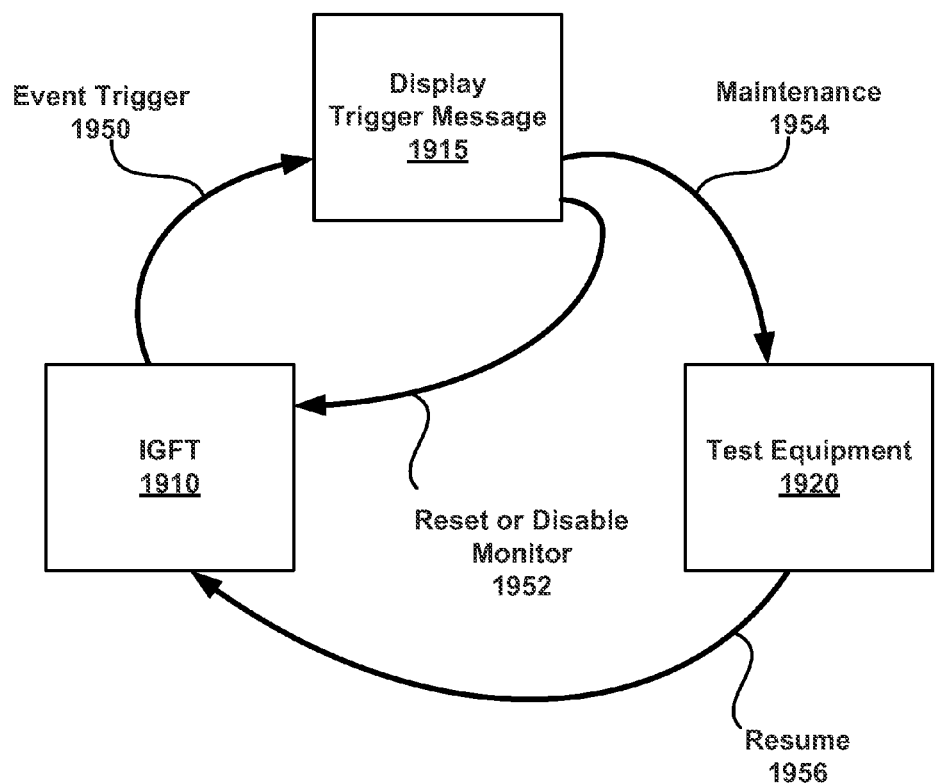
FIG. 19 illustrates an exemplary system including quality monitors, in accordance with one embodiment.

FIG. 19 illustrates an exemplary system for the quality monitors, in accordance with one embodiment. As shown, an integrator 1910 signals test equipment 1920 to start lot testing. For example, during the lot testing, one or more integrator monitoring events are triggered. See item 1950. Next, the integrator 1910 pauses the lot testing and displays a trigger message 1915. The integrator then waits for a line response.

For example, the line that identified the event may respond due to a problem with the test equipment 1920. In this example, the test equipment 1920 is brought down for maintenance. See item 1954. Testing may resume (see item 1956) after the maintenance is completed on the test equipment 1920. In another example, the quality monitors may be reset or disabled (see item 1952) in order to resume testing (again, see item 1956).

Figure 20:
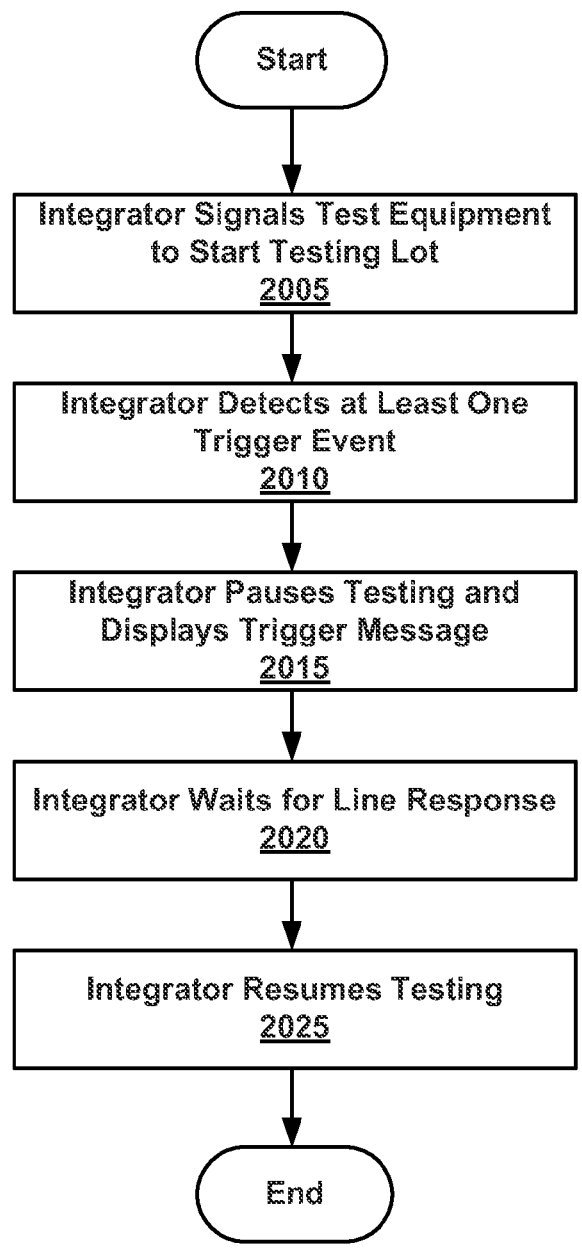
FIG. 20 illustrates a method for handling the quality monitors, in accordance with one embodiment.

FIG. 20 illustrates a method for handling the quality monitors, in accordance with one embodiment. First, in operation 2005, the integrator signals test equipment to start the testing of the lot. During testing of the lot, an integrator may detect at least one trigger event, as in operation 2010. Following the trigger event(s), the integrator pauses testing of the lot and displays a trigger message in operation 2015. Next, in operation 2020, the integrator waits for a line response. After the line response, the integrator may resume testing in operation 2025.

In another embodiment, the quality monitors may provide a mechanism for individual customized messages. Further, the integrator may provide individual customized messages on a per integrated circuit basis. For example, if a total yield limit is lower than the targeted yield, the integrator may stop the production and prompt an error message to the user. The error message to the user may contain the appropriate pre-defined instructions given by the product engineers to the line. In one embodiment, the pre-defined instructions are configured using the navigator application.

In one embodiment, the quality monitors may provide a mechanism for individual monitoring control. Every monitor specified in the setup file may be displayed. As an option, the status of the monitor may be modified during run time. For example, three actions may be performed on each monitor: enable, disable, or reset. The enable action requests to enable a previously disabled monitor. The disable action requests to disable a previously enabled monitor. Further, operations may be resumed after the enable action is performed. In addition, the reset action requests to re-initialize the monitor. Furthermore, operations may be resumed after the reset action is performed.

Still yet, in another embodiment, the quality monitors may provide a mechanism for local moving window monitors. In the local moving window monitor, the integrator may monitor the last portion of a lot as defined in the navigator setup files. Optionally, the local moving window monitor allows the integrator to detect testing problems earlier than with a cumulative monitor for the entire lot. In one embodiment, the local moving window monitor may be used in conjunction with at least the total yield monitor, the site yield monitor, the total bin monitor, the site bin monitor, the total fail monitor, and the site fail monitor.

In addition, the navigator may optionally include an option to disable, enable or reset the local moving window monitor, in addition to configuring parameters for the window size in integrated circuits, a consecutive number of failures, a non-consecutive number of failures, and a trigger message. Furthermore, the navigator may optionally include an option to disable, enable or reset the total window monitor, in addition to configuring parameters for a consecutive number of failures, a non-consecutive number of failures, and a trigger message.

In another embodiment, the quality monitors may provide a mechanism for a count-based monitor. The count-based monitor may monitor for pre-defined numeric limits on consecutive and non-consecutive occurrences. Optionally, the occurrences may be fail bin occurrences.

In one embodiment, the quality monitors may provide a mechanism for a percentage based monitor. The percentage based monitor monitors the dynamically changing limits based on the percentage of integrated circuits already tested. Optionally, the percentage based monitor allows for use of the same percentage based limit for lots with a large size difference. As an option, the local moving window monitor may be used in conjunction with at least the total bin monitor, the site bin monitor, and the site fail monitor.

In one example, it may not be useful to specify a fail limit of 300 failures for integrated circuits tested in lots of 1,000 and 10,000 integrated circuits. Thus, the percentage based monitor may be utilized to specify a fail limit to 5% of the previously tested integrated circuits.

Still yet, in another embodiment, the quality monitors may provide a mechanism for a yield monitor. The yield monitor may monitor an overall or cumulative minimum and maximum yield limit for a lot. As an option, the yield limit may be a percentage. Optionally, if the yield limit is beyond the minimum and maximum yield limit, the integrator may pause testing of the lot and may display a trigger message.

In yet another embodiment, the yield monitor may monitor site yield to monitor drift in multi-site testing performance. Optionally, the yield monitor may monitor each site's minimum yield separately. In addition, the yield monitor may monitor the minimum yield for each site separately and may compare the yield among all the sites. Further, the yield monitor may provide a delta yield where the maximum yield for all of the sites is compared to the yields of the remaining sites.

For example, the delta yield for the site yield monitor is set to 10%. The site yields, and delta yield calculations are described in Table 6 in accordance with the present example. In the following example, Site 3 has exceeded the 10% delta yield limit, and therefore, the integrator may pause testing of the lot and may display a trigger message.

TABLE 6

| Site | Yield | Delta Yield Calculation |
| --- | --- | --- |
| Site 0 | 90% | Maximum yield |
| Site 1 | 84% | 90% - 84% = 6% |
| Site 2 | 86% | 90% - 86% = 4% |
| Site 3 | 79% | 90% - 79% = 11% |

In one embodiment, the quality monitors may provide a mechanism for a bin monitor. Optionally, the bin monitor may be implemented by the integrator, and may allow for quality improvements on various hard and soft bins. For example, the bin monitor may alert a user to degradation of performance of the selected bins in the test cell.

Further, in one embodiment, the bin monitor may combine various hard bins and soft bins into one monitor. For example, 32 monitors may be provided for the bin monitor, however, any number of monitors may be implemented. In another embodiment, the bin monitor allows for tracking of both consecutive and non-consecutive occurrences of monitored bins. Furthermore, the bin monitor may also provide site monitoring where each site's test bin yield is monitored.

Figure 21:
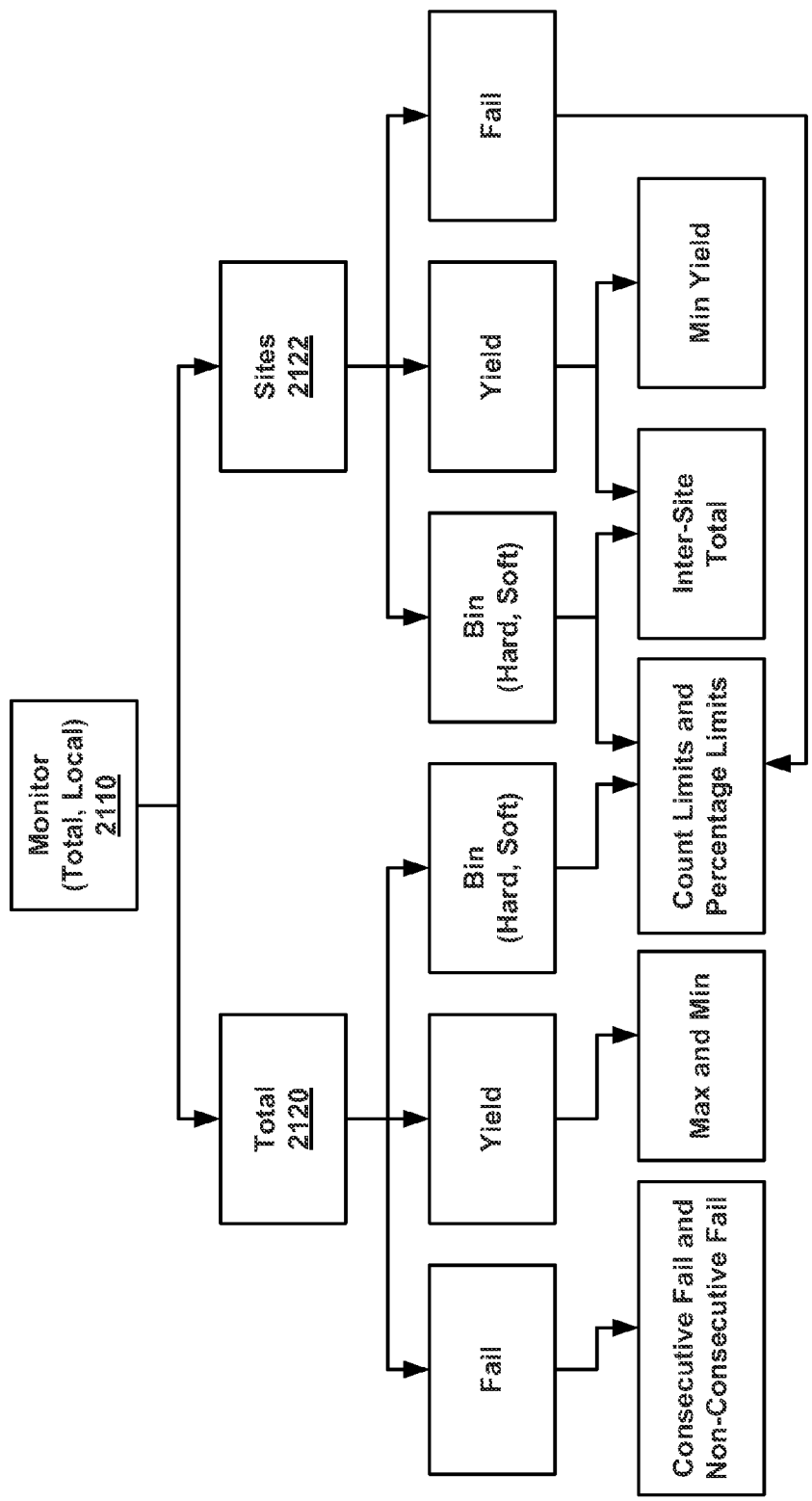
FIG. 21 illustrates features of a quality monitor, in accordance with one embodiment.

FIG. 21 illustrates features of a quality monitor, in accordance with one embodiment. As shown, a quality monitor 2110 may include total 2120, local, and site 2122 monitors. The optional features of the quality monitor 2110 are described in Table 7 in accordance with the present example.

TABLE 7

Figure 22:
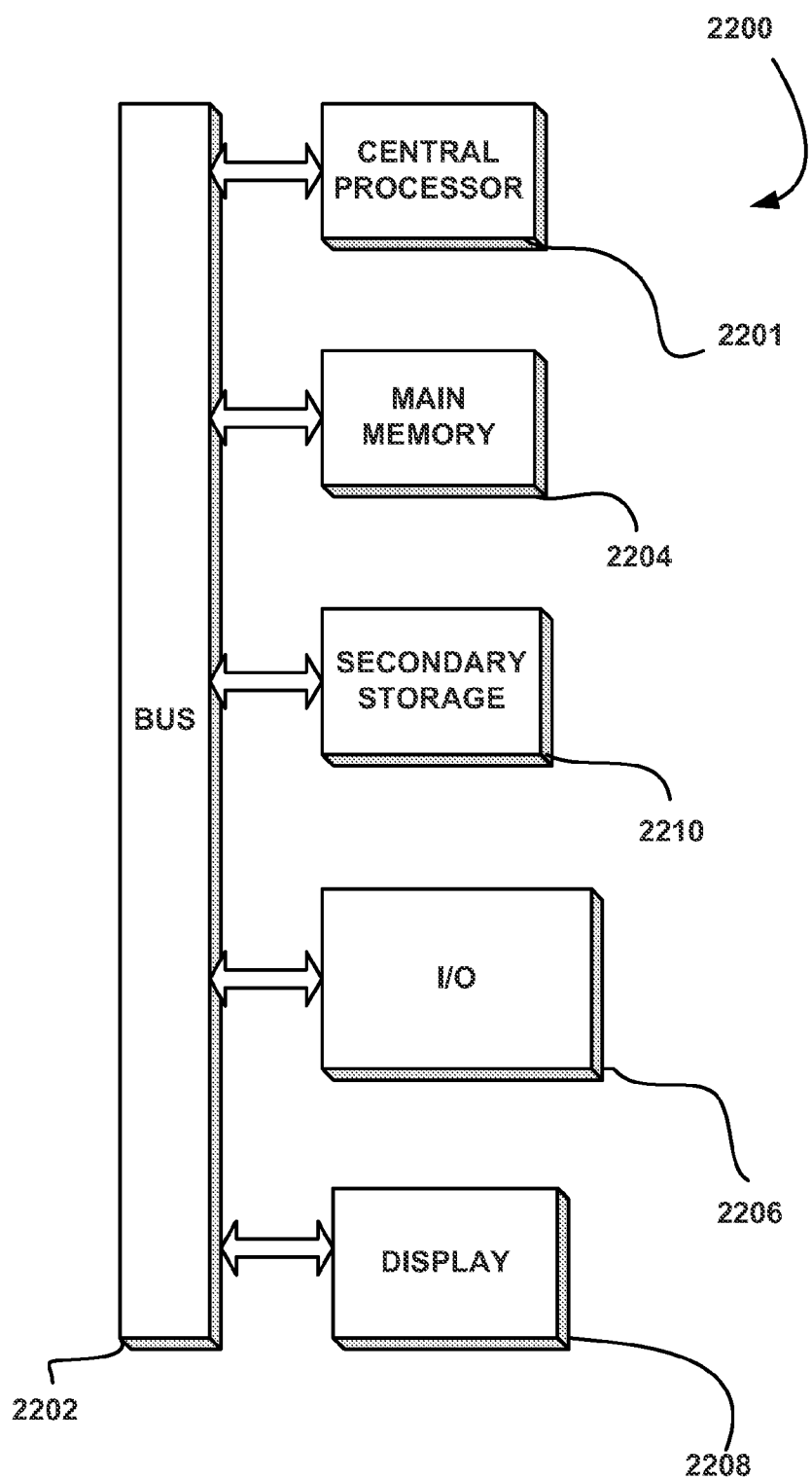
FIG. 22 illustrates an exemplary system in which the various architecture and/or functionality of the various previous embodiments may be implemented.

1. Total Yield Monitor
    a. Total Fail Monitor
        i. Consecutive Fail
        ii. Non-consecutive Fail
    b. Local Fail Monitor
        i. Consecutive Fail
        ii. Non-consecutive Fail
    c. Total Yield Monitor
        i. Maximum Yield
        ii. Minimum Yield
    d. Local Yield Monitor
        i. Maximum Yield
        ii. Minimum Yield
2. Total Bin Monitor
    a. Total Bin Monitor
        i. Count Limits
        ii. Percent Limits
    b. Local Bin Monitor
        i. Count Limits
        ii. Percent Limit
3. Site Yield Monitor
    a. Site Fail Monitor
        i. Count Limits
        ii. Percent Limits
    b. Local Site Fail Monitor
        i. Count Limits
        ii. Percent Limits
    c. Site Yield Monitor
        i. Minimum Yield
        ii. Inter-site Delta Yield
    d. Local Site Yield Monitor
        i. Minimum Yield
        ii. Inter-site Delta Yield
4. Site Bin Monitor
    a. Site Bin Monitor
        i. Count Limits
        ii. Percent Limits
        iii. Inter-Site Delta Limits
    b. Local Site Bin Monitor
        i. Count Limits
        ii. Percent Limits
        iii. Inter-Site Delta Limits FIG. 22 illustrates an exemplary computer system 2200 in which the various architecture and/or functionality of the various previous embodiments may be implemented. As shown, a computer system 2200 is provided including at least one host processor 2201 which is connected to a communication bus 2202. The computer system 2200 also includes a main memory 2204. Control logic (software) and data are stored in the main memory 2204 which may take the form of random access memory (RAM).

The computer system 2200 also includes various I/O devices 2211 (e.g. keyboard, mouse, camera, microphone, etc.) and a display 2208, i.e. a computer monitor. The computer system 2200 may also include a secondary storage 2210. The secondary storage 2210 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 2204 and/or the secondary storage 2210. Such computer programs, when executed, enable the computer system 2200 to perform various functions. Memory 2204, storage 2210 and/or any other storage are possible examples of computer-readable media.

In one embodiment, such computer programs may be used to carry out the functionality of the previous figures. Further, in other embodiments, the architecture and/or functionality of the various previous figures may be implemented in the context of the host processor 2201, a chipset (i.e. a group of integrated circuits designed to work and sold as a unit for performing related functions, etc.), and/or any other integrated circuit for that matter.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    testing a group of integrated circuits; and
    before finishing the testing, re-testing at least one of the integrated circuits of the group, utilizing a processor;
    wherein the re-testing includes in-line re-testing;
    wherein the in-line re-testing includes dynamic in-line retesting that allows for modification of the re-testing for optimizing for yield initially and then for throughput by being turned on and off based on a pre-defined yield limit.

2. The method of claim 1, wherein a single one of the integrated circuits is re-tested.

3. The method of claim 1, wherein all of the integrated circuits of the group are re-tested.

4. The method of claim 1, wherein a lot includes a plurality of the groups.

5. The method of claim 1, wherein the re-testing is performed in near real-time.

6. The method of claim 1, wherein the re-testing is performed in real-time.

7. The method of claim 1, wherein the testing occurs during a first pass, and the re-testing occurs during a second pass separate from the first pass.

8. The method of claim 1, wherein it is determined whether at least one of the integrated circuits fails the testing.

9. The method of claim 8, wherein, if it is determined that at least one of the integrated circuits fails the testing, the re-testing is initiated.

10. The method of claim 1, wherein the re-testing includes a low bin recovery rate.

11. The method of claim 1, wherein the re-testing includes a loss of a first pass test bin result.

12. The method of claim 1, wherein results of the re-testing are identified.

13. The method of claim 12, wherein the results of the re-testing are output before finishing the testing of the group of integrated circuits.

14. The method of claim 12, wherein the re-testing is adjusted based on the results.

15. The method of claim 1, wherein the testing or the re-testing is for quality assurance purposes.

16. The method of claim 1, wherein the in-line re-testing is performed by:
    capturing, by an integrator, one of in-line re-test hard bin results and in-line re-test soft bin results;
    sending, by the integrator, a re-grip signal to a handler for bin re-grip;
    sending, by the handler, a start of test (SOT) signal and a "Run-R" signal to a tester;
    re-testing, by the tester, the at least one of the integrated circuits in response to the receipt of the start of test (SOT) signal and the "Run-R" signal;
    sending, by the tester, a result of the re-test to the integrator; and
    sending, by the integrator, the result of the re-test to the handler.

17. The method of claim 1, wherein the in-line re-testing includes:
  (a) sending, by an integrator, a re-grip signal to a handler for bin re-grip;
  (b) sending, by the integrator, a start of test (SOT) signal and a "Run-R" signal to a tester;
  (c) re-testing the at least one of the integrated circuits in response to the receipt of the start of test (SOT) signal and the "Run-R" signal;
  (d) sending, by the tester, a result of the re-test to the integrator; and
  (e) sending, by the integrator, the result of the re-test to the handler; and
  (f) repeating (a)-(e) until a designated sample size has been collected.

18. A non-transitory computer readable medium with a computer program product embodied thereon, the computer program product comprising:
  computer code for testing a group of integrated circuits; and
  computer code for re-testing at least one of the integrated circuits of the group before finishing the testing;
  wherein the re-testing includes in-line re-testing;
  wherein the computer program product is operable such that the in-line re-testing includes dynamic in-line retesting that allows for modification of the re-testing for optimizing for yield initially and then for throughput by being turned on and off based on a pre-defined yield limit.

19. A system, comprising:
  at least one tester for testing a group of integrated circuits, and re-testing at least one of the integrated circuits of the group before finishing the testing;
  wherein the re-testing includes in-line re-testing;
  wherein the tester is operable such that the in-line re-testing includes dynamic in-line retesting that allows for modification of the re-testing for optimizing for yield initially and then for throughput by being turned on and off based on a pre-defined yield limit.

* * * * *